United States Patent [19]

Itom et al.

[11] Patent Number: 5,367,980
[45] Date of Patent: Nov. 29, 1994

[54] METHOD OF PRODUCING DEFECT-FREE PERFECT SURFACES

[75] Inventors: Noriaki Itoh, Nagoya; Yasuo Nakai, Kani; Ken Hattori, Tokyo; Junichi Kanasaki, Aichi; Akiko Okano, Toyota, all of Japan

[73] Assignee: President of Nagoya University, Nagoya, Japan

[21] Appl. No.: 82,370

[22] Filed: Jun. 28, 1993

[30] Foreign Application Priority Data

Oct. 6, 1992 [JP] Japan .................. 4-267470

[51] Int. Cl.$^5$ ........................................... H01L 21/20
[52] U.S. Cl. ..................... 117/108; 437/105; 437/107; 437/133; 437/173
[58] Field of Search ............... 156/612; 437/173, 105, 437/107, 133; 117/108

[56] References Cited

U.S. PATENT DOCUMENTS

| | | | |
|---|---|---|---|
| 4,959,245 | 9/1990 | Dobson et al. | 156/612 |
| 4,962,057 | 10/1990 | Epler et al. | 437/173 |

Primary Examiner—R. Bruce Breneman
Assistant Examiner—Ramamohan Rao Paladugu
Attorney, Agent, or Firm—Oblon, Spivak, McClelland, Maier & Neustadt

[57] ABSTRACT

A basic sample having a surface is set in an ultrahigh vacuum chamber. Atoms constituting the sample are deposited on the surface of the sample to remove vacancy-type defects. A laser beam having a predetermined wavelength and a predetermined fluence is radiated on the sample to remove adatom-type and kink-type defects, thereby producing a defect-free surface. In addition, the same material as that for a basic sample is deposited on a defect-free surface to produce a defect-free thin film.

14 Claims, 8 Drawing Sheets

METHOD OF PRODUCING DEFECT-FREE PERFECT SURFACES

BACKGROUND OF THE INVENTION

1. Field of the Invention

The present invention relates to a method of producing defect-free perfect surfaces and a method of producing defect-free thin film crystals by using the same.

2. Description of the Related Art

It is a dream of semiconductor engineers to produce semiconductor crystals having few defects. Up to now, there have been utilized a wafer produced from a crystal formed of a material of high purity and annealed at a high temperature, and an epitaxial layer produced by depositing molecules on a substrate.

The former, however, cannot avoid thermal defects in the process of growth and annealing, while the latter cannot avoid structural defects in the process of growth.

SUMMARY OF THE INVENTION

It is an object of the present invention to provide a method of producing defect-free surfaces and a method of producing perfect thin film crystals by depositing defect-free layers by using the same.

According to the present invention, there is provided a method of producing a defect-free perfect surface, comprising the steps of:

(a) setting a basic sample having a surface in an ultra-high vacuum chamber; and (b) removing a vacancy-type defect by depositing atoms, constituting the sample, on the surface of the sample, and removing adatom-type and kink-type defects by irradiating the sample with a laser beam having a predetermined wavelength and a predetermined fluence.

According to the present invention, there is provided a method of producing a defect-free thin film crystal, comprising the steps of:

(a) setting a basic sample having a surface in an ultra-high vacuum chamber;

(b) removing a vacancy-type defect by depositing atoms, constituting the sample, on the surface of the sample, and removing adatom-type and kink-type defects by irradiating the sample with a laser beam having a predetermined wavelength and a predetermined fluence;

(c) depositing a layer consisting of the same material as that for the sample on the surface from which the defects are removed; and (d) removing defects from a surface of the deposited layer by the same step as in the step (b).

Defects on a crystal surface are classified into adatom-type defects, kink-type defects, and vacancy-type defects. Atoms constituting adatom-type and kink-type defects are less strongly bonded to each other than atoms constituting a perfect portion of the surface. Therefore, by breaking the bonds of the atoms constituting these types of defects, the defects can be removed.

The present invention is based on the finding that if high-sensitive measurement of measuring atoms emitted from the surface of a compound semiconductor or the like by radiating a laser beam on the surface is performed, the atom emissions arising from breaking the bonds of these atoms can be detected.

According to the present invention, a surface is irradiated with a laser beam having a predetermined fluence to remove adatom-type and kink-type defects, and a small amount of component atoms are deposited on the surface to remove vacancy-type defects, thereby producing a defect-free perfect surface.

An epitaxial layer is further deposited on the perfect surface, and is converted into a defect-free perfect surface by the above-described method. Epitaxial layers are sequentially deposited in the same method to produce a defect-free perfect thin film single crystal.

According to the present invention, adatom-type and kink-type defects are removed by irradiating a surface with a laser beam having a predetermined fluence, and vacancy-type defects are removed by depositing a small amount of component atoms. Therefore, a defect-free perfect surface, which cannot be produced by the prior art, can be produced.

In addition, an epitaxial layer is further deposited on the perfect surface, and is converted into a defect-free perfect surface by the above-described method. Subsequently, layers are deposited one by one by the same method, thereby producing a defect-free perfect single crystal. If, for example, a semiconductor device is manufactured by using such a material, the characteristics of the device can be improved.

Furthermore, if a perfect crystal is produced on a perfect basic sample surface, the interface between the sample and the perfect crystal is free from defects. Therefore, a great improvement in interface characteristics can be expected.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims,

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

Production and Measurement Apparatus

Figure 1:
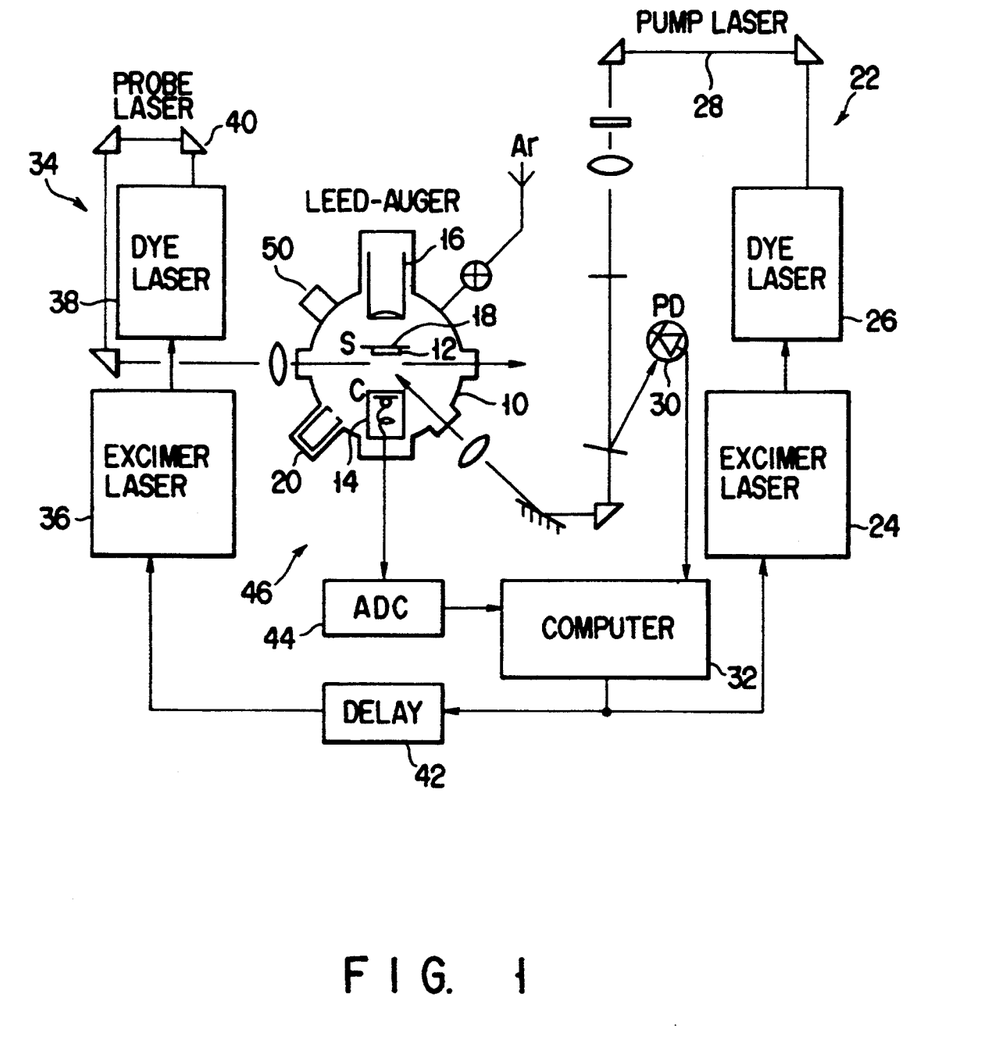
FIG. 1 is a block diagram showing a schematic arrangement of an apparatus for executing a method of producing defect-free perfect surfaces according to an embodiment of the present invention.

FIG. 1 shows an apparatus for executing a method of producing defect-free perfect surfaces and a method of producing thin film crystals having few defects according to an embodiment of the present invention.

A sample 12 is placed in a vacuum chamber 10. A channel plate or Channeltron 14 for counting atoms emitted from a sample is disposed on the front surface side of the sample 12. A LEED (low-energy electron-diffraction)-Auger 16 for observing the front surface of the sample 12 is disposed on the lower surface side of the sample 12. A sample holder 18 is rotatable and is rotated to direct the front surface of the sample 12 to the Channeltron 14 or to the LEED-Auger 16 depending on which one of them is used. In addition, an ion gun 20 for performing argon ion bombardment with respect to the surface of the sample 12 is disposed in the vacuum chamber 10.

A laser system 22 serving as a pump laser is disposed on the right side in FIG. 1. The laser system 22 includes an excimer laser 24, a dye laser 26 pumped by the excimer laser 24 to emit a laser having a wavelength of nearly 600 nm, an optical system 28 for guiding a laser beam from the dye laser 26 to the sample 12, and a photodetector 30 for measuring the fluence of the laser beam emitted from the dye laser 26. The laser beam emitted from the dye laser 26 passes through the optical system 28 to be incident on the surface of the sample 12 at an angle of 45°. This laser beam is a 28-ns pulse-like laser beam having a spot size of 0.5 mm. The pulse period of the laser beam is controlled by a computer 32. The laser beam emerging from the laser system 22 is radiated on the surface of the sample 12 to cause emission of atoms from the surface of the sample 12. Note that an output from the photodetector 30 is supplied to the computer 32, so that the fluence of the laser beam incident on the surface of the sample 12 is stored.

A laser system 34 serving as a probe laser is disposed on the left side in FIG. 1. This laser system 34 includes an excimer laser 36, a dye laser 38 pumped by the excimer laser 36, and an optical system 40 for guiding a laser beam from the dye laser 38 to the surface of the sample 12. The laser beam emitted from the dye laser 38 passes through the optical system 40 to propagate parallel to the surface of the sample 12 at a distance of 2.0 mm. This laser beam is a 28 ns pulse-like laser beam having a spot size of about 1.0 mm. The period of the laser beam is controlled by the computer 32.

The probe excimer laser pulse is delayed by a delay circuit 42, so that the laser beam emerging from the laser system 34 is supplied parallel to the surface of the sample 12 with a delay of 3.3 $\mu$s with respect to the laser beam emerging from the laser system 22. That is, the laser beam from the laser system 34 is supplied parallel to the surface of the sample 12 after the laser beam from the laser system 22 is radiated on the surface of the sample 12 and atoms are emitted from the surface of the sample 12. As a result, atoms emitted from the surface of the sample 12 are ionized to be detected. A resonance-ionization method is used in this detection.

The atoms ionized by the resonance-ionization method are detected by the Channeltron 14. The resultant current is analog/digital-converted by an ADC 44. The output from the ADC 44 is supplied to the computer 32. As a result, the number of emitted atoms is counted to obtain a yield Y of the emitted atoms. A system constituted by the Channeltron 14, the ADC 44, and the computer 32 will be referred to as a measurement system 46 hereinafter.

In addition, a deposition unit 50 is disposed in the vacuum chamber 10. The deposition unit 50 executes, for example, the MBE (Molecule Beam Epitaxy) method or the vapor deposition method to deposit atoms, constituting the sample 12, on the surface of the sample 12. When the deposition unit 50 is to be operated, the sample holder 18 is rotated to direct the surface of the sample 12 to the deposition unit 50.

Production of defect-free surfaces and defect-free crystals

Figure 2:
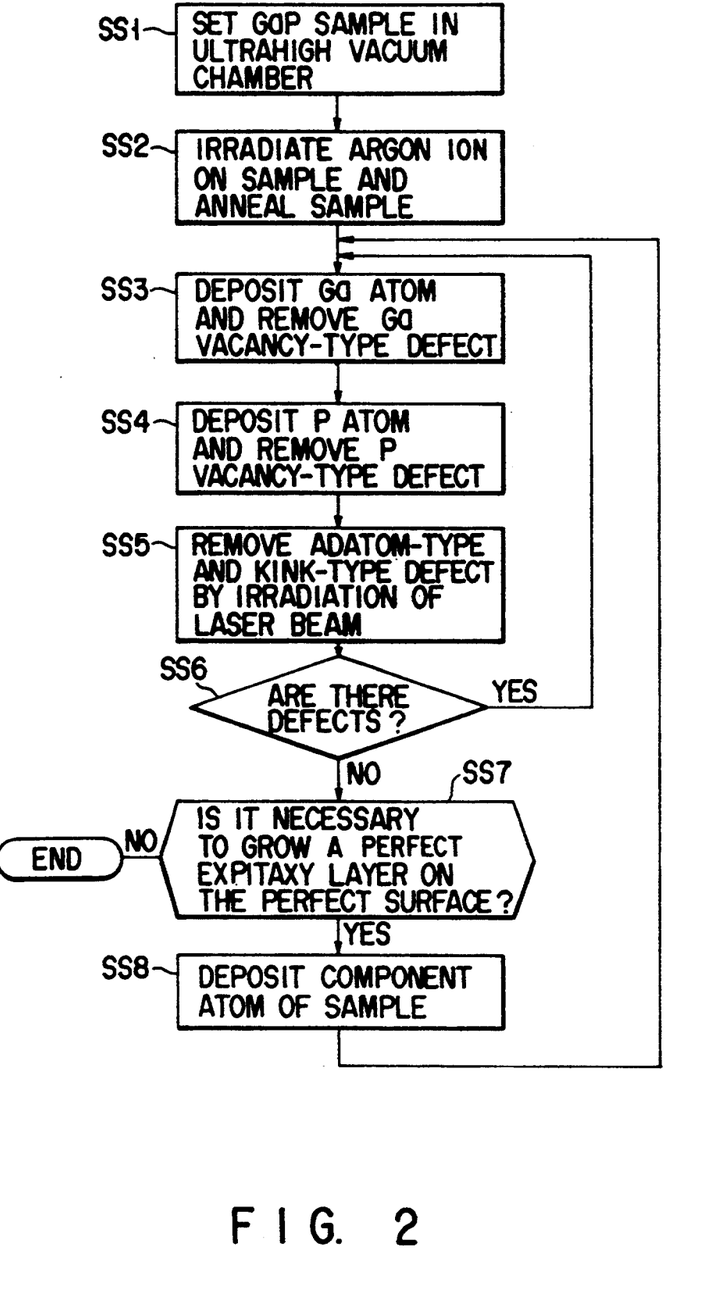
FIG. 2 is a flow chart showing a procedure based the method of producing defect-free perfect surfaces according to the embodiment of the present invention.

An embodiment of the present invention associated with a GaP sample will be described below with reference to FIG. 2. In step SS1, a GaP sample 12 is set in the ultrahigh vacuum chamber 10 with a degree of vacuum of about $10^{10}$ Torr.

In step SS2, the ion gun 20 is used to irradiate the surface of the sample 12 with 0.5-keV argon ions at a beam current of 2 to 3 $\mu$A for 30 min, and the resultant structure is annealed thermally at 500° to 600° C. at intervals of 10 min by using a heat source (not shown) arranged on the sample holder 18. Argon ion irradiation and thermal annealing are repeated to clean the surface of the sample 12. In this state, a low-energy electrondiffraction image of the surface of the sample 12 is observed by using the LEED-Auger 16, thus checking the state of the surface of the sample 12.

In step SS3, Ga atoms are deposited on the surface of the sample 12 by using the deposition unit 50, and vacancy-type defects due to Ga atoms are removed from the surface of the sample 12.

In step SS4, P atoms are deposited on the surface of the sample 12 by using the deposition unit 50, and vacancy-type defects due to P atoms are removed from the surface of the sample 12. It is known that Ga and P atoms can move on a GaP crystal surface. Ga or P atoms which move on a crystal surface are captured by vacancy-type defects, and the lattice vacancies are filled with the respective atoms, thereby removing the vacancy-type defects.

Figure 4A:
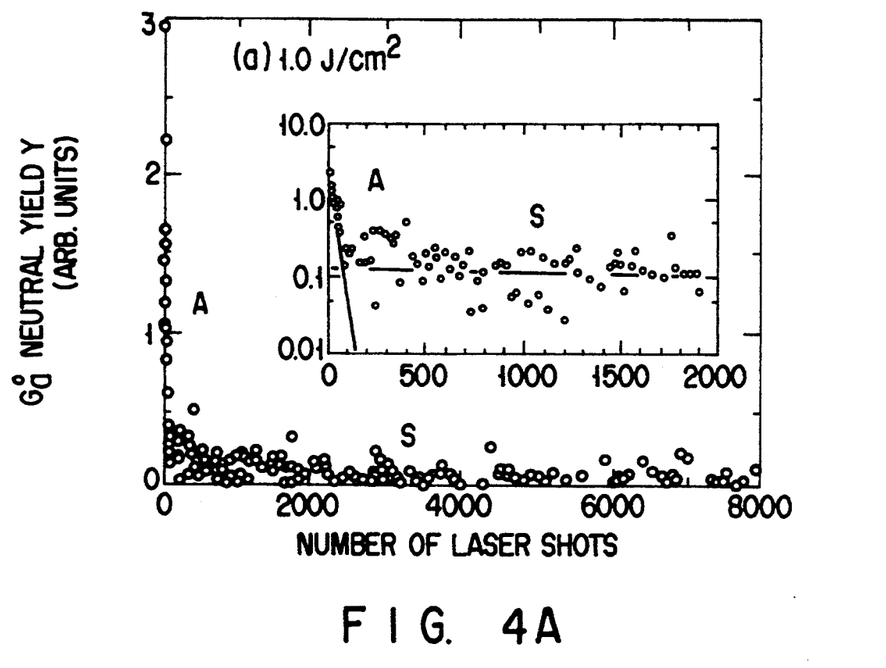
FIGS. 4A and 4B are graphs, each showing the relationship between the number of laser shots and the emission yield with the laser fluence serving as an index.

In step SS5, a laser beam is radiated on the surface of the sample 12 by using the laser system 22 to cause atom emission due to protruding defects (adatom-type and kink-type defects) protruding from the crystal surface. A laser beam to be used has a wavelength of 600 nm and a pulse width of 10 ns. By irradiation of this laser beam, atoms constituting adatom-type and kink-type defects on the surface of the sample 12 are emitted from the surface, and the defects are removed. When a laser beam pulse is radiated on the surface of the sample 12, the emission yield rapidly decreases first (denoted by A) and slowly decreases subsequently (denoted by B), as shown in FIG. 4A. This measurement is performed by using the laser system 34 and the measurement system 46. In this case, the laser fluence must be set to be small enough to prevent ablation (surface destruction). An ablation threshold for GaP is 1.0 J/cm$^2$.

Of surface defects, a rapidly decreasing portion A is based on surface adatom-type defects, which can be removed by radiating a laser beam about 100 times. A slowly decreasing portion B is based on kink-type defects, which can be reduced in number to about ½ by radiating a laser beam about 5,000 times. In order to increase the removal efficiency of kink-type defects, laser beam irradiation may be performed in a halogen atmosphere. If, for example, laser beam irradiation is performed in a $Br_2$ (bromine) atmosphere, the emission yield Y is increased by about 100 times. In order to completely remove kink-type defects, laser beam irradiation may be performed about 10,000 times.

Note that if the sample 12 consists of GaAs, laser beam irradiation may be performed under the following conditions: a laser beam pulse wavelength of 900 nm, a pulse width of 10 ns, and an ablation threshold of 0.4 $J/cm_2$.

In the process of atom deposition for the intention of removing vacancy-type defects, atoms may be captured by kink-type and adatom-type defects. However, the captured atoms are simultaneously emitted by the laser beam irradiation in step SS5.

In addition, in the process of atom deposition on the surface of a compound semiconductor, an atom may be captured by a vacancy-type defect of the opposite type. For example, a Ga atom may be captured by a P atom lattice vacancy (anti-site lattice vacancy). It is confirmed theorically that such atoms can be emitted by laser beam irradiation or laser beam irradiation in a halogen atmosphere. In this case, although new vacancy-type defects are caused by laser beam irradiation, the defects can be sequentially removed from the surface by depositing P atoms again in step SS4, as will be described later.

In step SS6, it is checked whether there are defects on the surface of the sample 12. This step will be described in detail below in "Determination of quantity of defects by laser". If it is determined in step SS6 that there are defects, the flow returns to step SS3. Steps SS3 to SS5 are then repeated until all defects are removed.

If it is determined in step SS6 that there are no defects, the flow advances to step SS7 to check whether it is necessary to deposit an epitaxial layer on the surface of the sample 12. If NO in step SS7, the processing is ended. In this manner, the surface of the sample 12 is converted into a defect-free perfect surface.

If YES in step SS7, the flow advances to step SS8 to form a first epitaxial layer of one mono-layer on the surface of the sample 12 by using the deposition unit 50.

The flow returns to step SS3. Steps SS3 to SS6 are then repeated to convert the surface of the first epitaxial layer of one mono-layer into a defect-free perfect surface. The flow advances to step SS7 again to check whether it is necessary to deposit a second epitaxial layer having one mono-layer. If YES in step SS7, the second epitaxial layer is deposited. The surface of the second epitaxial layer is converted into a defect-free perfect surface. In this manner, these steps are repeated to produce a defect-free thin film crystal having a desired number of layers.

Measurement of quantity of defects by laser

Figure 3:
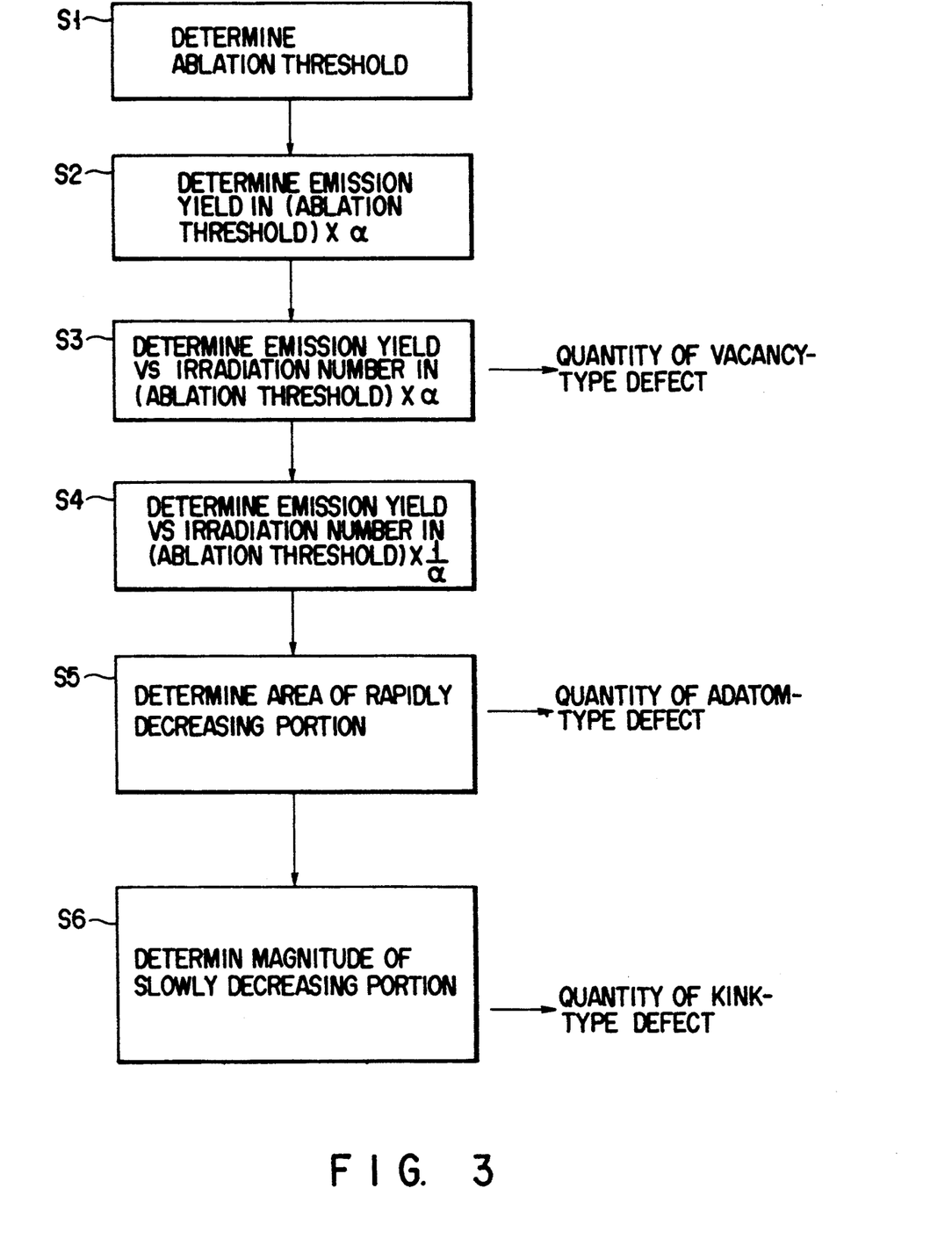
FIG. 3 is a flow chart showing a procedure based a method of determining a small quantity of surface defects according to the present invention.

A method of measuring a small quantity of surface defects will be described next with reference to FIG. 3.

In step S1, an ablation threshold for the sample 12 formed in the ultrahigh vacuum chamber 10 is determined. The ablation threshold is a laser fluence above which formation of a vacancy-type defect is started, specifically, a laser fluence at which the probability that an atomic bond near a vacancy-type defect is broken by one laser pulse is almost unity. Below the ablation threshold, atoms are emitted from only adatom-type and kink-type defects. However, above the ablation threshold, a vacancy-type defect is the source of the emission. Therefore, by properly determining this ablation threshold, measurement of the quantity of adatom-type and kink-type defects can be separated from measurement of the quantity of vacancy-type defects.

Figure 4B:
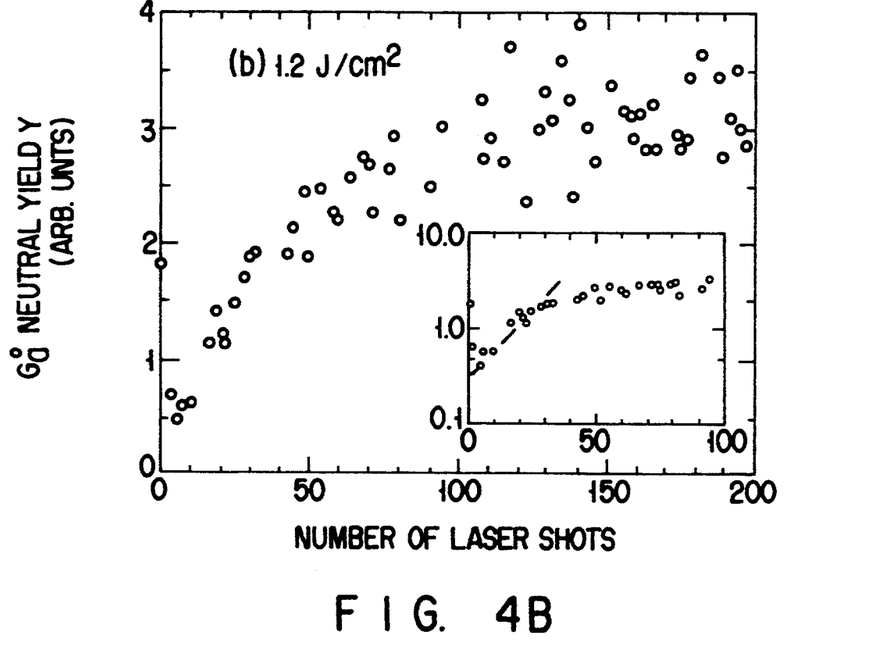

An ablation threshold is determined in the following manner. A pulse-like laser beam is radiated on the surface of the sample 12 by using the laser system 22. The yield Y of atoms emitted from the surface of the sample 12 is measured by using the laser system 34 and the measurement system 46. FIGS. 4A and 4B respectively show measurements of emission yields using the fluence of a laser beam radiated on the surface of the sample 12 as an index. FIG. 4A shows the relationship between the number of laser shots and the emission yield Y of Ga atoms in a case wherein the laser fluence is set to be 1.0 $J/cm^2$. FIG. 4B shows the relationship between the number of laser shots and the emission yield Y of Ga atoms in a case wherein the laser fluence is set to be 1.2 $J/cm^2$.

Referring to FIG. 4A, a region corresponding to reference symbol A indicates the quantity of Ga atoms emitted from adatom-type defects, and a portion corresponding to reference symbol S indicates the quantity of Ga atoms emitted from kink-type defects. That is, a laser fluence of 1.0 $J/cm^2$ does not cause the emission from a vacancy-type defect and hence is lower than the ablation threshold.

The dependence of the emission yield Y of Ga atoms on the number of laser shots, which is shown in FIG. 4B, is obtained at a laser fluence of 1.2 $J/cm^2$. This dependence on the number of laser shots is totally different from that shown in FIG. 4A. FIG. 4B shows that vacancy-type defects are the source of the emission at this laser fluence. Therefore, a laser fluence of 1.2 $J/cm^2$ is higher than the ablation threshold.

In this manner, the dependence of the emission yield Y on the number of laser shots is obtained while the laser fluence is changed, and the laser fluence at which the dependence on the number of laser shots changes is obtained. The obtained laser fluence is then set to be an ablation threshold.

Above the ablation threshold, vacancy-type defects on the surface of the sample 12 are the source of the emission. It is empirically known that the number of atoms emitted is proportional to the quantity of vacancy-type defects which are originally present on the surface of the sample 12. Therefore, the quantity of original vacancy-type defects can be determined by measuring the number of atoms emitted above the laser ablation threshold. In steps S2 and S3, the quantity of vacancy-type defects is measured on the basis of the this knowledge.

In step S2, a laser beam having a fluence of (ablation threshold) $\times \alpha$ is radiated on the surface of the sample 12 repeatedly by using the laser system 22 to obtain the emission yield Y by using the laser system 34 and the measurement system 46. Assume that $\alpha$ is about 1.1. That is, the radiated laser beam has a fluence slightly higher than the ablation threshold.

In step S3, the quantity of vacancy-type defects is determined on the basis of the rate of increase in the emission yield Y with respect to the number of laser shots. If an emission coefficient $q_r$ is used to indicate the quantity of vacancy-type defects, and the laser fluence, the exponent, and the quantity of defects are respectively represented by $\phi$, n, and $N_r$, respectively, the emission yield Y is given by $$Y = q_r \phi^n N_r \quad (1)$$

Figure 5:
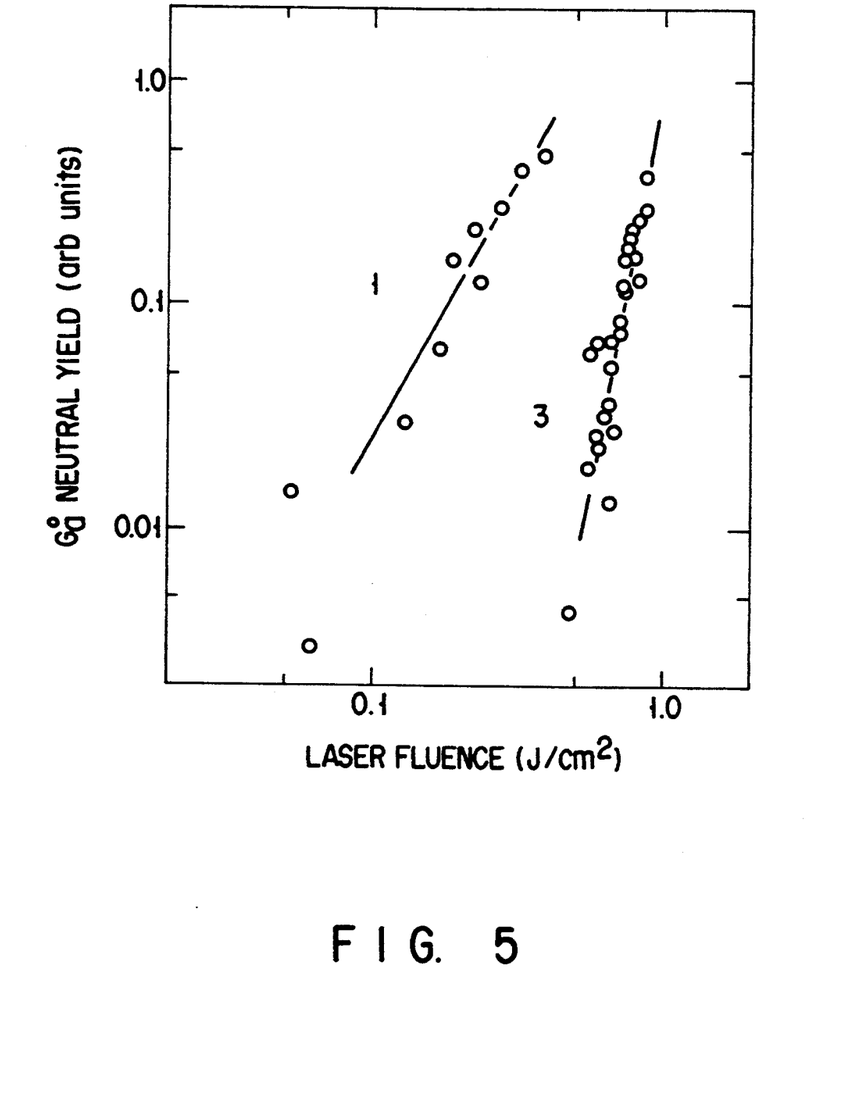
FIG. 5 is a graph showing the relationship between the laser fluence and the emission yield.

The emission coefficient $q_r$ and the exponent n are determined by a preliminary experiment in advance according to equation (1). In this preliminary experiment, a scanning tunneling microscope (STM; not shown) is scanned over a wide range on the sample 12 to determine the quantity $N_r$ of vacancy-type defects. The emission yield Y is measured while the laser fluence $\phi$ is changed within a range higher than the ablation threshold. When the logarithms of both the sides of equation (1) are obtained, a curve is plotted as in the graph shown in FIG. 5. The exponent n is determined from the slope of this curve, and the emission coefficient $q_r$ is determined from the intersecting point between the curve and the ordinate. Since the value of the emission yield Y in an arbitrary unit obtained by the measurement in step S2 can be calibrated into an absolute value, the quantity $N_r$ of vacancy-type defects can be obtained by using equation (1).

In step S4, a laser beam having a fluence of (ablation threshold)/$\alpha$ is radiated on the surface of the sample 12 repeatedly by using the laser system 22 to obtain the emission yield Y by using the laser system 34 and the measurement system 46. As described above, the value a is set to be about 1.1. That is, the radiated laser beam has a fluence slightly lower than the ablation threshold. When the laser beam having a fluence slightly lower than the ablation threshold is radiated in this manner, atoms are emitted from adatom-type and kink-type defects. The data obtain in this step indicates the relationship between the emission yield and the number of laser shots, and can be divided into a rapidly decreasing portion A and a slowly decreasing portion S, as shown in FIG. 4A.

In step S5, the area (total quantity of emitted atoms) of the rapidly decreasing portion A is obtained to determine the quantity of adatom-type defects. Note that the ordinates in FIGS. 4A and 4B indicate values in an arbitrary unit and hence need to be calibrated into absolute values. For this purpose, a predetermined quantity of Ga atoms, e.g., $10^{-4}$ ML (mono atomic layers, are caused to adhere to a silicon substrate, and a laser beam having the same fluence as that of the laser beam used in step S4 is radiated on the Ga atoms to emit all the Ga atoms. An area corresponding to the resultant graph is then calculated to determine the unit of the emission yield Y on the ordinate. Note that the quantity of Ga atoms caused to adhere to the silicon substrate is measured with a film thickness measurement unit (not shown) capable of measuring a thickness corresponding to about 0.1 ML, and interpolation is performed by using the adhesion time.

In step S6, the magnitude of the emission yield of the slowly decreasing portion S obtained in step S4 is determined to obtain the quantity of kink-type defects. Note that the quantity of kink-type defects is expressed by using an emission coefficient $q_s$, similar to the quantity of vacancy-type defects. That is, if the laser fluence, the exponent, and the quantity of defects are respectively represented by $\phi$, n, and $N_s$, the emission yield Y is given by $$Y = q_s \phi^n N_s \quad (2)$$

The emission coefficient $q_s$ and the exponent n are determined by a preliminary experiment in advance according to equation (2). In this preliminary experiment, the scanning tunneling microscope (STM) is scanned over a wide range on the sample 12 to determine the quantity $N_s$ of kink-type defects. The emission yield Y is measured while the laser fluence $\phi$ is changed within a range lower than the ablation threshold. When the logarithms of both the sides of equation (2) are obtained, a curve is plotted as in the graph shown in FIG. 5. The exponent R is determined from the slope of this curve, and the emission coefficient $q_s$ is determined from the intersecting point between the curve and the ordinate. Since the value of the emission yield Y in an arbitrary unit obtained by the measurement in step S4 can be calibrated into an absolute value, the quantity $N_s$ of kink-type defects can be obtained by using equation (2).

In the above-described embodiment, the quantity of vacancy-type defects is measured first, and the quantities of adatom-type and kink-type defects are measured subsequently. However, the order of measurement is not limited to this. It will be obvious to those skilled in the art that measurement of the quantity of vacancy-type defects, measurement of the quantity of adatom-type defects, and measurement of the quantity of kink-type defects can be executed in a proper order.

Method of improving measurement sensitivity

In the above description, atoms emitted by one pulse from the laser system 22 are ionized by the laser system 34, and the resultant ion current pulse is measured by the measurement system 46, thereby measuring the emitted atoms of $10^{-5}$ ML per pulse. In this case, the number of ions included in one ion current pulse is about $10^4$. If this method is replaced with a counting method to perform measurement in which an ion count in one ion current pulse is 0.1, the measurement sensitivity can be increased by $10^5$ times, and the maximum sensitivity can be set to be $10^{-10}$ ML.

Types of defects

Figure 6A:
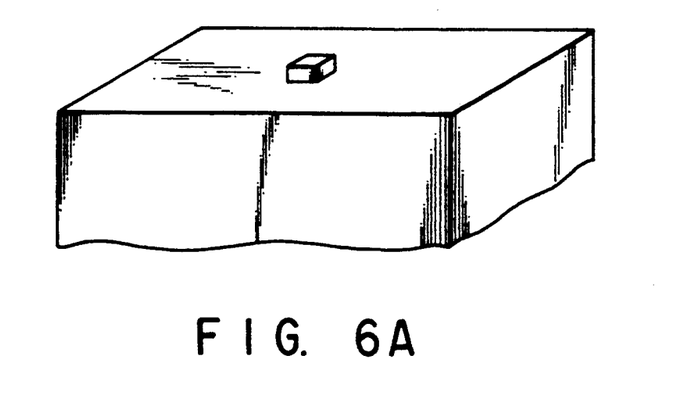
FIGS. 6A to 6C are schematic views respectively showing the structures of adatom-type, kink-type, and vacancy-type defects.
Figure 6B:
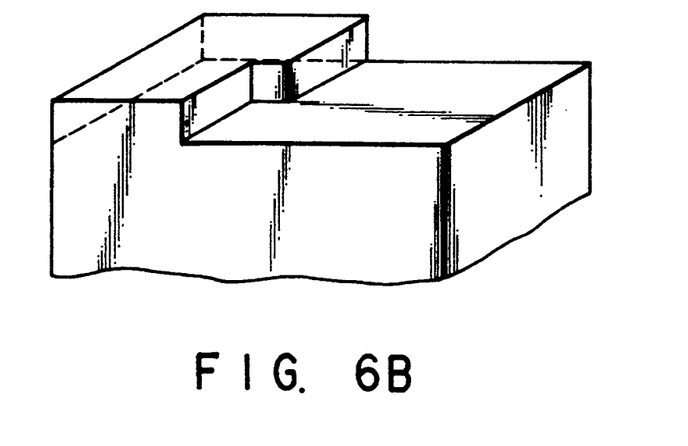
Figure 6C:
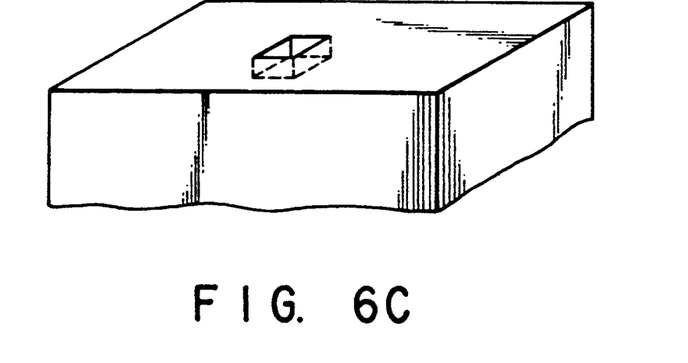

The adatom-type, kink-type, and vacancy-type defects described above are defects having structures such as those shown in FIGS. 6A, 6B, and 6C, respectively. The adatom-type defect is a defect adhering to a crystal surface and protruding therefrom. The kink-type defect is a defect in the form of a step on a crystal surface. The vacancy-type defect is a defect due to the absence of an atom at a lattice position on a crystal surface.

More specifically, there are weakly bonded atoms (to be referred to as WBAs hereinafter) near a defect. Defects can be classified into the following three types on the basis of a change accompanying the removal of one WBA near a defect:

(1) adatom-type defect: A defect adhering to a perfect crystal surface independently or in the form of an island. When this defect is removed, an almost perfect crystal surface appears.

(2) kink-type defect: when an atom is emitted from a defect, a similar defect is newly formed at a neighboring site. A kink in the form of a step on a crystal surface is an example of this type. This defect can be eliminated only by removing many portions protruding from the surface.

(3) vacancy-type defect: A defect whose defective region is enlarged when an atom is emitted from the defect.

Materials to which the invention can be applied

Materials to which the measurement method of the present invention can be applied must satisfy the following requirements:

(1) They must be nonmetallic materials. In nonmetallic materials, recombination of an electron-hole pair supplies energy corresponding to the width of a forbidden band to a lattice system.

(2) They must be materials in which an electron-hole pair is recombined only through a defect. Silver halides, alkali halides, alkaline-earth fluorides, $SiO_2$, and the like cannot be used because recombination of electron-hole pairs or excitons occurs owing to lattice distortion due to their own existence (recombination due to self-capture).

(3) They must be polar crystals including no silicon. In nonpolar crystals such as silicon crystals, when a halogen of 1 ML is adsorbed in a crystal surface, a similar emission may be observed to perform the measurement of the present invention.

For example, materials to which the present invention can be applied are III–V Group compounds, II–VI Group compounds, ZnO, MgO, and CaO.

Laser wavelength

A proper laser wavelength used in the method of the present invention will be described below. In the present invention, as described above, adatom-type, kink-type, and vacancy-type defects are measured. In order to remove adatom-type and kink-type defects from the surface of the sample 12 by irradiation with a laser beam, surface electron-hole pairs must be formed, and as many as possible.

Figure 7:
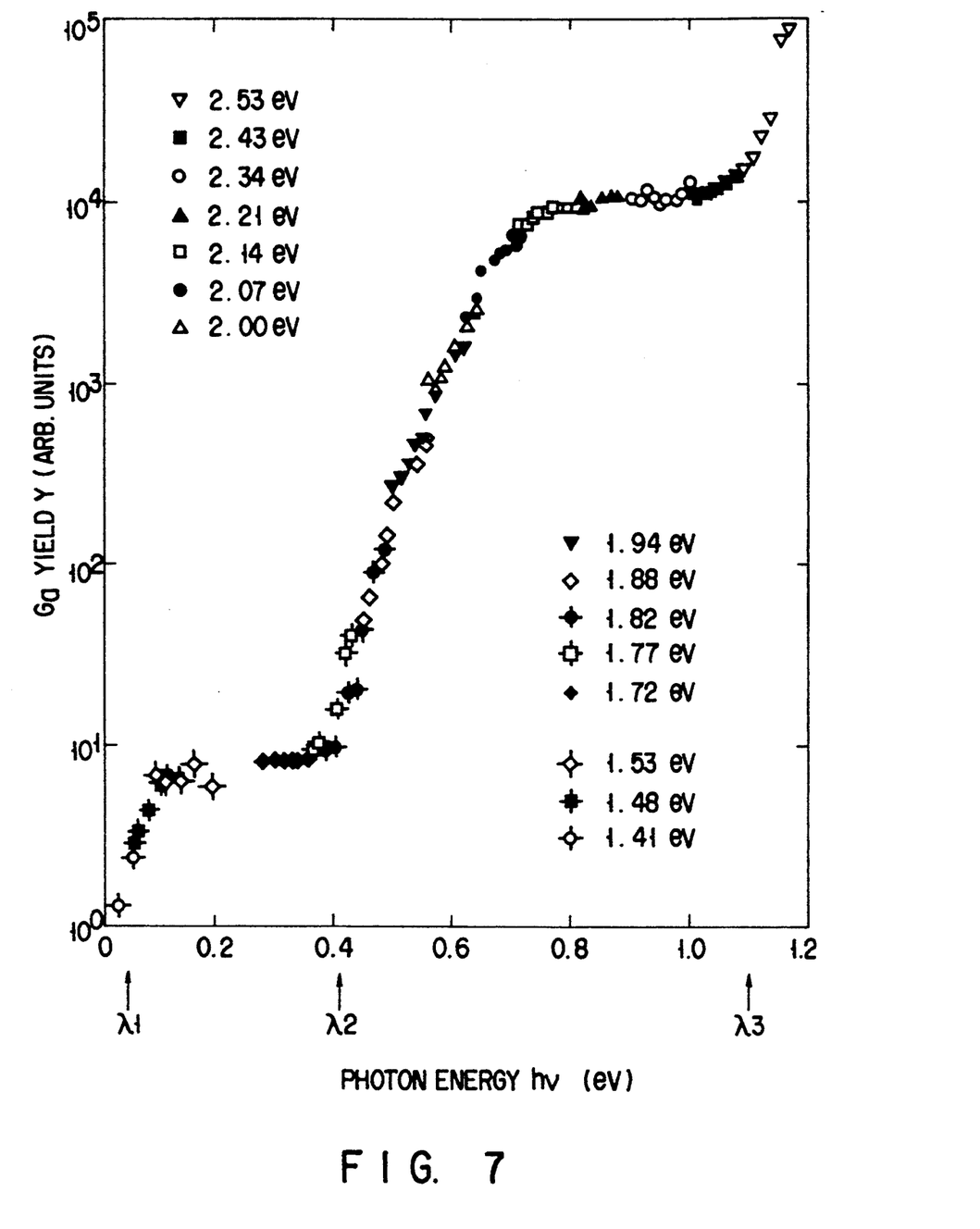
FIG. 7 is a graph showing the energy dependence an emission yield Y of GaAs.

FIG. 7 shows the energy (wavelength) dependence of the emission yield Y of GaAs. Referring to FIG. 7, a wavelength λ1 is a wavelength at which the excitation cross section from the bulk valence band to the bulk conduction band is increased; a wavelength λ2, a wavelength at which the excitation cross section from the surface valence band to the bulk conduction band is increased; and a wavelength λ3, a wavelength at which the excitation cross section from the surface valence band to the surface conduction band is increased. It is apparent from FIG. 7 that the emission yield is greatly increased above a wavelength at which the electron in the surface valence band can be excited. Therefore, the wavelength of a beam having photon energy higher than that of a beam having the wavelength λ3 is preferably used as a laser beam wavelength for the method of the present invention in order to perform measurement with high sensitivity.

Figure 8:
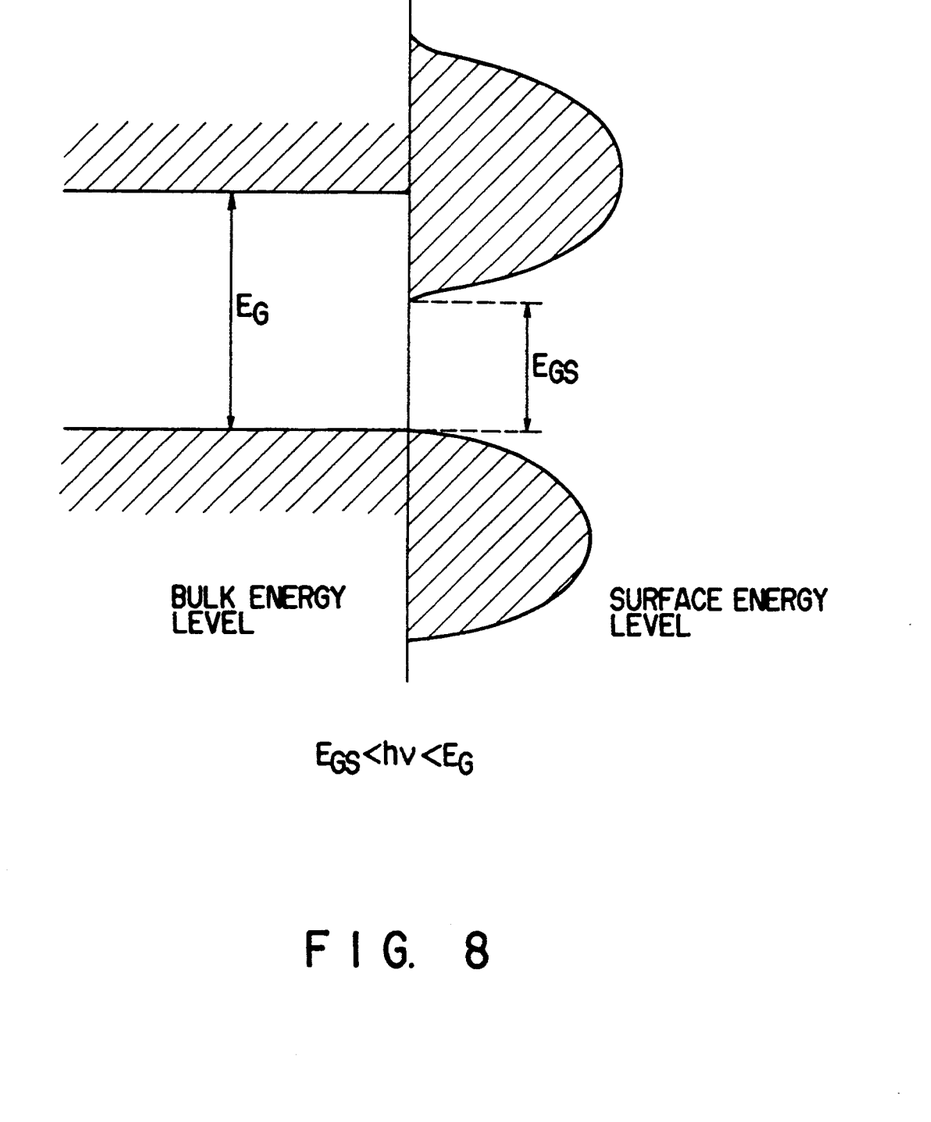
FIG. 8 is an energy band diagram of a GaP surface and a GaP bulk.

GaP has surface and bulk energy levels such as those shown in FIG. 8. As is apparent from FIG. 8, in order to form surface electron-hole pairs as many as possible, it is preferable that a photon energy hν be lower than a bulk band gap $E_G$ and higher than a surface band gap $E_{GS}$ ($E_{GS} < h\nu < E_G$). When the photon energy exceeds the bulk band gap $E_G$, excitation from the bulk valence band to the bulk conduction band is increased, resulting in a reduction in yield. Since GaP is subjected to indirect type excitation, the yield of electron-hole pairs in the valence band is small. Therefore, with an energy exceeding the band gap $E_G$, 2D electron-hole pairs may be scattered to the 3D bulk.

In this manner, a proper laser wavelength which allows the formation of a maximum number of surface electron-hole pairs needs to be selected in accordance with a material used.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of removing defects on a surface and producing a defect-free surface, wherein no atom on the surface that is irrelevant to the defects is removed, comprising the steps of:
    (a) setting a basic sample having a surface in an ultra-high vacuum chamber; and
    (b) making the surface defect-free by removing a vacancy-type defect, by depositing atoms of an element forming the basic sample on the surface of the basic sample, and by removing adatom-type and kink-type defects without removing atoms irrelevant to the defects, by irradiating the surface of the basic sample with a laser beam, said laser beam irradiation having a determined wavelength and fluence.

2. A method according to claim 1, wherein the laser beam has a fluence that is less than an ablation threshold of the basic sample.

3. A method according to claim 1, further comprising the step of (c) determining a quantity of vacancy-type defects by radiating a laser beam having a fluence that is greater than an ablation threshold of the basic sample onto the surface and measuring a first emission yield Y1, and determining quantities of adatom-type and kink-type defects by repeatedly radiating a pulsed laser beam having a fluence that is less than the ablation threshold onto the surface to obtain a relation between a second emission yield Y2 and the number n of laser pulses, the quantity of the adatom-type defects being obtained by determining an area under a first portion of the relation between Y2 and n, and the quantity of the kink-type defects being obtained by determining a magnitude of the second emission yield Y2 of a second portion of the relation between Y2 and n, the first portion having a steeper negative slope second portion,
    wherein, when it is determined in the step (c) that there is a defect, the step (b) is executed again.

4. A method of producing a defect-free thin film crystal, comprising the steps of:
    (a) setting a basic sample having a surface in an ultra-high vacuum chamber;
    (b) removing a vacancy-type defect by depositing atoms of an element forming the basic sample on the surface of the basic sample, and removing adatom-type and kink-type defects by irradiating the surface of the basic sample with a laser beam having a determined wavelength and fluence;
    (c) depositing a layer consisting of the same material as that forming the basic sample on the surface of the basic sample from which the defects are removed; and
    (d) removing defects from a surface of the deposited layer by the same step in the step (b).

5. A method according to claim 4, wherein the laser beam has a fluence that is less than an ablation threshold of the basic sample.

6. A method according to claim 4, further comprising the step of (e) determining a quantity of vacancy-type defects by radiating a laser beam having a fluence that is greater than an ablation threshold of the basic sample and measuring a first emission yield Y1, and determining quantities of adatom-type and kink-type defects by repeatedly radiating a pulsed laser beam having a fluence that is less than the ablation threshold to obtain a relation between a second emission yield Y2 and the number n of laser pulses, the quantity of the adatom-type defects being obtained by determining an area under a first portion of the relation between Y1 and n, and the quantity of kink type defects being obtained by determining a magnitude of the second emission yield Y2 of a second portion of the relation between Y2 and n, the first portion having a steeper negative slope than the second wherein, when it is determined in the step (e) that any defects remain, the step (b) or (d) is executed again.

7. A method according to claim 1, wherein the basic sample is formed from a polar compound.

8. A method according to claim 7, wherein the polar compound is selected from a member of the set consisting of III-V Group compounds, II-IV Group compounds, ZnO, MgO, and CaO.

9. A method according to claim 1, wherein the basic sample has a bulk energy gap which is greater than a surface energy gap and the predetermined wavelength corresponds to a photon energy that is greater than the surface energy gap and less than the bulk energy gap.

10. A method according to claim 1, wherein the basic sample is formed from gallium phosphide, the determined fluence is less than one Joule per square centimeter .and the determined wavelength is greater than or equal to 600 nanometers.

11. A method according to claim 10, wherein the determined wavelength is about 600 nanometers.

12. A method according to claim 1, wherein the basic sample is formed from gallium arsenide, the determined fluence is less than 0.4 Joules per square centimeter, and the determined wavelength is greater than or equal to 900 nanometers.

13. A method according to claim 12, wherein the determined wavelength is about 900 nanometers.

14. A method according to claim 1, further comprising the steps of:

determining the atom emission yield of the surface of the basic sample versus laser fluence and laser wavelength; and determining the determined wavelength and fluence, based upon the determined emission yield as a function of laser wavelength and fluence.

* * * * *